United States Patent
Malik et al.

(10) Patent No.: US 6,615,146 B1
(45) Date of Patent: Sep. 2, 2003

(54) FAILURE DETECTION OF AN ISOLATION DEVICE WITH PFA SIGNAL GENERATION IN A REDUNDANT POWER SUPPLY SYSTEM

(75) Inventors: Randhir Singh Malik, Cary, NC (US); William Hemena, Raleigh, NC (US); Eino Alfred Lindfors, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/721,132

(22) Filed: Nov. 22, 2000

(51) Int. Cl.[7] .............................. G01R 31/00; H02H 3/20
(52) U.S. Cl. .............................. 702/58; 702/59; 702/64; 361/90; 361/92
(58) Field of Search .............................. 702/57, 58, 59, 702/64, 65; 323/272, 278; 361/86–92; 363/56.11, 21.18, 72; 307/31, 35–39

(56) References Cited

U.S. PATENT DOCUMENTS

| | | | |
|---|---|---|---|
| 4,403,213 A | | 9/1983 | Khamare et al. |
| 4,428,020 A | * | 1/1984 | Blanchard, Jr. .............. 361/90 |
| 4,535,410 A | | 8/1985 | O'Mara |
| 4,559,497 A | | 12/1985 | Farrugia |
| 4,703,410 A | * | 10/1987 | Pepper ..................... 363/21.18 |
| 4,912,621 A | * | 3/1990 | Kobayashi et al. ...... 363/21.04 |
| 5,019,996 A | | 5/1991 | Lee |
| 5,027,002 A | * | 6/1991 | Thornton .................... 323/278 |
| 5,122,726 A | * | 6/1992 | Elliott et al. ................ 323/272 |
| 5,648,759 A | | 7/1997 | Miller et al. |

* cited by examiner

*Primary Examiner*—Bryan Bui
(74) *Attorney, Agent, or Firm*—Sawyer & Associates

(57) ABSTRACT

Aspects of failure detection of an isolation device in a power supply of a redundant power supply system are described. The aspects include an isolation device coupled to a voltage input line of a power supply. A comparator coupled to the isolation device provides a predictive failure analysis (PFA) signal when the isolation device fails.

7 Claims, 1 Drawing Sheet

FAILURE DETECTION OF AN ISOLATION DEVICE WITH PFA SIGNAL GENERATION IN A REDUNDANT POWER SUPPLY SYSTEM

FIELD OF THE INVENTION

The present invention relates to redundant power supply systems, and more particularly to providing a monitoring circuit to detect failure of isolation devices in redundant power supply systems.

BACKGROUND OF THE INVENTION

While the size and speed of electronic components have received much focus and attention in the advancement of digital technology, ensuring proper power delivery to the components has remained a concern. The various branches within a system that rely on a power supply tend to be numerous and require differing levels of power. As the number of components within a system increases, the chance for failures and damage of the power supply of a system also increases.

Typically, a plurality of redundant power supplies is utilized to ensure proper power delivery and integrity within electronic systems. The parallel arrangement of power supplies within a redundant power supply system often employs an isolation device. The isolation device, usually referred to as a switching OR-ing MOSFET, within each power supply acts as a mechanism to protect the power system bus from shorting in the situation that one of the power supply nodes shorts to ground. While the OR-ing MOSFET does provide rudimentary isolation capabilities, if the OR-ing MOSFET itself shorts, the system is unable to detect that condition. Unfortunately, when shorted itself, the ability to provide isolation is lost, and any other failure that causes the associated power supply node to short to ground will cause the entire power system to crash. Accordingly, a need exists for a technique to detect and indicate the presence of a failure of an isolation device in a redundant power supply system. The present invention addresses such a need.

SUMMARY OF THE INVENTION

The present invention provides aspects for failure detection of an isolation device in a power supply of a redundant power supply system. The aspects include an isolation device coupled to a voltage input line of a power supply. A comparator coupled to the isolation device provides a predictive failure analysis (PFA) signal when the isolation device fails.

Through the present invention, a straightforward and effective approach to detecting and signaling presence of a failure condition for an isolation device in a power supply of a redundant power supply system is achieved. These and other advantages of the present invention will be more fully understood in conjunction with the following detailed description and accompanying drawings.

DETAILED DESCRIPTION OF THE INVENTION

The present invention relates to a failure detection circuit for an isolation device in a redundant power supply system. The following description is presented to enable one of ordinary skill in the art to make and use the invention and is provided in the context of a patent application and its requirements. Thus, the present invention is not intended to be limited to the embodiment shown, but is to be accorded the widest scope consistent with the principles and features described herein.

Figure 1:
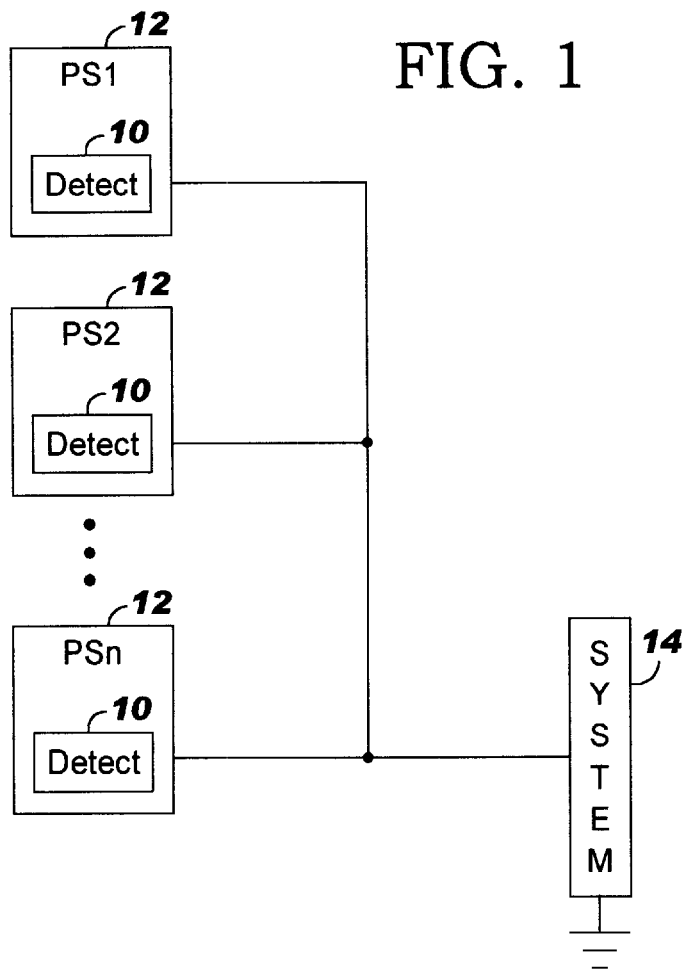
FIG. 1 illustrates a block diagram of a redundant power system with an isolation device failure detection circuit in accordance with the present invention.

For a redundant power supply system, such as that shown in FIG. 1, the present invention provides an isolation device failure detection circuit 10 within each power supply 12, each power supply 12 coupled to and providing power for a system 14, e.g., a computer processing system. In general, the circuit 10 detects the failure of an isolation device and sends a PFA (predictive failure analysis) signal to the system 14. The PFA signal provides an indication to the system 14 that the isolation device of a power supply 12 has failed. In this manner, that power supply 12 is identified as needing to be replaced before any short occurs on its secondary side.

Figure 2:
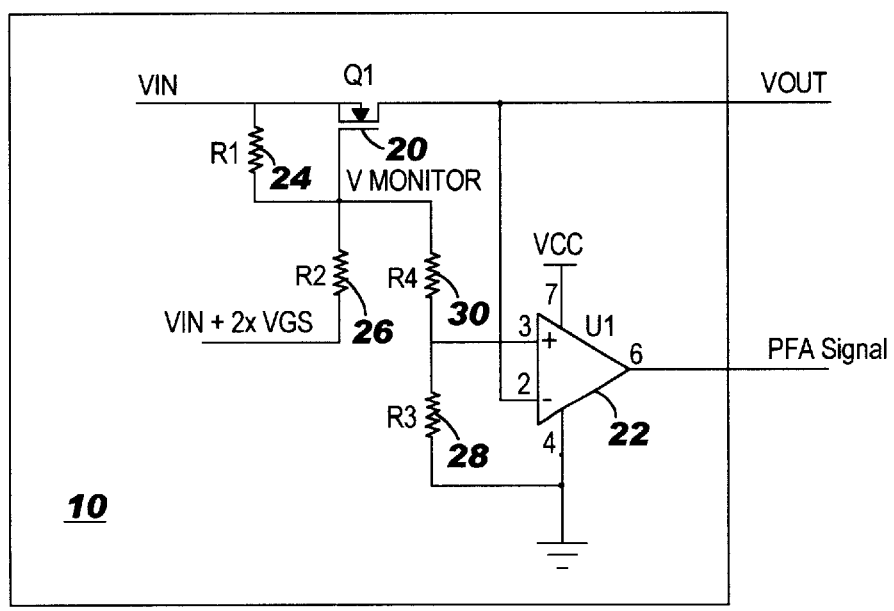
FIG. 2 illustrates a circuit diagram for a preferred embodiment of the isolation device failure detection circuit in accordance with the present invention.

Referring now to FIG. 2, a diagram of a preferred embodiment of the circuit 10 is illustrated. A transistor 20 (Q1) acts as the isolating device (i.e., the OR-ing MOSFET) by turning off when VIN shorts to ground in order to protect the power system bus from shorting. To ensure such protection is not hampered by transistor 20 shorting itself, the circuit 10 further includes a comparator 22 (U1), and a plurality of resistors 24 (R1), 26 (R2), 28 (R3), and 30 (R4).

During normal operation, a gate voltage greater than VIN+2VGS is applied to transistor 20, where VGS is the gate to source threshold voltage of transistor 20 (e.g., about 4.5 V). The gate node denoted VMONITOR is coupled to the non-inverting input of the comparator 22, as shown. When operating normally, VMONITOR is higher than an output line voltage, VOUT, and the signal output from comparator 22, the PFA signal, is at a "HIGH" level. In this manner, the PFA signal indicates that the isolation device transistor 20 inside the power supply 12 is functioning properly. In the event of an internal short to the transistor 20, the PFA signal transitions to a "LOW" level, which provides a warning signal to the system 14 that the isolation device of transistor 20 inside the power supply 12 has failed, and the power supply 12 needs to be replaced at soon as possible.

By way of example, suppose VOUT=12V. When VIN+2VGS=20V, VMONITOR is equal accordingly to about 20V. During normal operation, the voltage at node 3 of comparator 22 is equal to VMONITOR * R3/R3+R4. Thus, if the ratio R3/R3+R4=¾, the voltage at node 3 is 15V. With the VOUT voltage equal to 12V, node 3 is higher than node 2, and so, the PFA signal output from comparator 22 is at a "HIGH" level.

During a short condition of transistor 20, VMONITOR is equal to 12V, so that the voltage at node 3 drops to 9V. With node 2 of comparator 22 still at 12V, node 3 is lower than node 2, and the output of the PFA signal from comparator 22 transitions to a low level to indicate the presence of a fault in the transistor 20 to the system 14.

Although the present invention has been described in accordance with the embodiments shown, one of ordinary skill in the art will readily recognize that there could be variations to the embodiments and those variations would be within the spirit and scope of the present invention. For example, the resistance values may be chosen to suit particular design needs, as is well understood in the art. Accordingly, many modifications may be made by one of ordinary skill in the art without departing from the spirit and scope of the appended claims.

What is claimed is:

1. A failure detection circuit for an isolation device in a power supply of a redundant power supply system, the circuit comprising:

an isolation device comprising a transistor coupled to a voltage input line of a power supply; and a comparator coupled to the isolation device for providing a predictive failure analysis (PFA) signal when the isolation device fails, wherein the comparator provides the PFA signal when a voltage level relative to a gate node of the transistor fills below a voltage level at an output voltage line of the power supply.

2. The circuit of claim 1 wherein the failure detection circuit is provided within each power supply of a redundant power system.

3. A redundant power supply system with isolation device failure detection capability, the system comprising:

a processing system; and a plurality of power supplies coupled in parallel to the processing system, each power supply including a failure detection circuit for detecting a failure of an isolation device within the power supply and providing a signal indicating the failure to the processing system, wherein the failure detection circuit further comprises a comparator coupled to the isolation device for providing a predictive failure analysis (PFA) signal when the isolation device fails, the isolation device comprising a transistor, wherein the comparator provides the PFA signal when the voltage level relative to a gate node of the transistor falls below a voltage level at an output voltage line of the power supply.

4. The system of claim 3 wherein the failure detection circuit detects a short condition of the isolation device.

5. A method for detecting a failure condition in an isolation device of a redundant power supply system, the method comprising:

providing an isolation device on an input voltage line of a power supply, the isolation device comprising a transistor; and utilizing a comparator with the isolation device for providing a predictive failure analysis (PFA) signal when the isolation device fails, including providing the PFA signal when a voltage level at a gate node of the transistor falls below a voltage level at an output voltage line of the power supply.

6. The method of claim 5 wherein utilizing a comparator further comprises utilizing the comparator to detect a short condition of the isolation device.

7. The method of claim 5 further comprising utilizing the isolation device and comparator within each power supply of a redundant power system.

* * * * *